United States Patent [19]
Lee

[11] Patent Number: 5,680,350
[45] Date of Patent: Oct. 21, 1997

[54] METHOD FOR NARROWING THRESHOLD VOLTAGE DISTRIBUTION IN A BLOCK ERASED FLASH MEMORY ARRAY

[75] Inventor: Roger R. Lee, Boise, Id.

[73] Assignee: Micron Technology, Inc., Boise, Id.

[21] Appl. No.: 355,752

[22] Filed: Dec. 14, 1994

[51] Int. Cl.$^6$ ............................................. G11C 11/34
[52] U.S. Cl. ............................... 365/185.24; 365/185.29; 365/185.33
[58] Field of Search ................................. 365/185, 218, 365/900, 185.24, 185.29, 185.33

[56] References Cited

U.S. PATENT DOCUMENTS

| | | | |
|---|---|---|---|
| 5,295,107 | 3/1994 | Okazawa et al. | 365/185.33 |
| 5,313,427 | 5/1994 | Schreck | 365/185.2 |
| 5,347,490 | 9/1994 | Terada et al. | 365/185 X |
| 5,400,286 | 3/1995 | Chu et al. | 365/185.24 |
| 5,452,248 | 9/1995 | Narwke et al. | 365/185.24 |

*Primary Examiner*—Joseph A. Popek
*Attorney, Agent, or Firm*—Angus C. Fox, III

[57] ABSTRACT

This invention constitutes a method for narrowing threshold voltage distribution among the individual cells of a block erased flash memory array by firstly, preprogramming cells within the block be erased to a level of saturation using hot electron injection to drive a surplus of electrons into the floating gate of each cell; secondly, subjecting all cells with the block to a first erase pulse which causes the surplus electrons within the floating gate of each cell to be driven into the cell's source region via Fowler-Nordheim tunneling, with the erase pulse being of sufficient length to erase every cell within the block; thirdly, subjecting all cells within the block to a word line stress step or a soft programming step, by means of which some electrons are driven back into the floating gate of each cell via Fowler-Nordheim tunneling or hot electron injection, respectively; and, fourthly, subjecting all cells within the block to a second erase pulse, the second erase pulse being at least an order of magnitude shorter than the first erase pulse. Use of the second erase pulse following the word line stress step not only shifts the threshold voltage distribution to a somewhat lower level, but also compresses the distribution. Since compression on the high side of the curve is greater than on the low side, the length of the second erase pulse can be tailored to fit the characteristics of a particular flash memory.

15 Claims, 3 Drawing Sheets

METHOD FOR NARROWING THRESHOLD VOLTAGE DISTRIBUTION IN A BLOCK ERASED FLASH MEMORY ARRAY

1. Field of the Invention

This invention relates to flash memory arrays and, more particularly, to a method for narrowing threshold voltage distribution in such an array following a block erase operation.

2. Background of the Invention

Block-erasable, electrically-programmable-floating-gate memories are generally known as "flash" memories. Referring now to FIG. 1, a flash memory cell is a specialized field-effect transistor having a drain region 11 to which a digit line 12 makes contact, a source region 13 to which a source line 14 makes contact, a channel region 15 between the drain and source regions, a floating gate 16, a gate oxide layer 17 between the channel region 15 and the floating gate 16, a word line 18 which functions as a control gate, and a dielectric layer 19 between the floating gate 16 and the word line 18.

During a typical flash memory cell programming operation, the source region is held at ground potential, the drain region at 6 volts, and the control gate at 12 volts. Under these conditions, electrons will be accelerated from the source region 13 through the channel region 15 to the drain region 11. Because of high electric field strength in the drain region, some of the electrons passing through the channel region are deflected upward from the drain region, having sufficient kinetic energy to be injected through the first gate oxide layer 17 into the floating gate 16. This phenomenon is known as hot electron injection. The trapping of electrons in the floating gate increases the threshold voltage of the device, resulting in no current through the digit line when the word line is activated during a read operation. A cell so programmed would generally be assigned a digital state of "0". The optimum threshold voltage of a programmed cell is generally acknowledged to be about 6 volts.

During a typical flash memory cell erase operation, the source region is held at 12 volts, word line at ground potential, and the drain region is allowed to float. Under these conditions, electrons in the floating gate will be attracted to the source region 13, and will pass through the first gate oxide layer 17 into that region via a phenomenon known as Fowler-Nordheim tunneling. Removal of electrons from the floating gate will decrease the threshold voltage of the device. The optimum threshold voltage of an erased cell is generally acknowledged to be about 2 volts. An erased (unprogrammed) cell is generally assigned a digital state of "1". If too many electrons are extracted from the floating gate during the erase operation, the threshold voltage will drop to such a low level that the device leaks current from the digit line to the source region. Although a digit line makes contact to many cells, only one word line (and hence, one cell on the digit line) is activated at a time. Thus, if an unprogrammed cell which is not being read has been over erased and is constantly leaking current to its associated digit line, a false "1" state may be determined by the sense amp when a programmed ("0" state) cell sharing the same digit line is read.

A number of procedures have been developed to mitigate the overerase problem. Flash memory blocks which are to be erased are currently subjected to the following sequence of steps:

(1) A preprogramming step, which employs the hot electron effect to inject electrons into the floating gate, thus ensuring that even cells which were unprogrammed during system operation are brought up to a programmed level;

(2) A long-pulse erase step which typically lasts about 500 milliseconds (most cells are completely erased in 50–150 milliseconds) and which employs Fowler-Nordheim tunneling to inject electrons from the floating gate into the source; and (3) A word line stress step, involving application of a high voltage to the word lines and grounding of either the source or drain, employs Fowler-Nordheim tunneling to force some electrons back into the floating gate from one or more regions held at ground potential (i.e., the substrate and/or the drain and/or the source).

Because of process variability, all cells do not react identically with respect to the ease with which they are programmed or erased. However, during the preprogramming step, electron injection is permitted to continue for a time sufficient to permit all cells within the array achieve a uniform level of programming (i.e., the programming level is self-limiting). Although all cells theoretically start at the same level when subjected to the erase step, the erase process occurs at varying rates. Thus after a selected interval sufficient to optimally erase the majority of the cells within the array, some cells will be over-erased, while others will be under-erased. The word line stress step, by which some electrons are returned to the floating gate, is used to eliminate the over-erase phenomenon and to narrow the voltage threshold distribution among the cells of the array. However, the word line stress step also has the effect of exacerbating the under-erase problem. Therefore, what is needed is a method for eliminating the under-erase problem and further narrowing threshold voltage distribution of block erased flash memory cells.

Some flash designers have chosen to use a "soft programming" step in place of the word line stress step. The soft programming step is similar to a standard programming step, with the exception that the voltage on the word lines is halved. Thus, the number of electrons injected into the floating gate via hot electron injection per unit of time is much reduced compared to the electron injection rate for a normal programming step. The important thing is that soft programming, though it uses hot electron injection, may be used as a substitute for word line stress, which utilizes Fowler-Nordheim tunneling.

SUMMARY OF THE INVENTION

This invention constitutes a method for narrowing threshold voltage distribution among the individual cells of a block erased flash memory array by performing the following sequence of steps during the block erase operation:

(1) preprogramming of all cells within the block be erased to a level of saturation using hot electron injection to drive a surplus of electrons into the floating gate of each cell;

(2) subjecting all cells with the block to a first erase pulse which causes the surplus electrons within the floating gate of each cell to be driven into the cell's source region via Fowler-Nordheim tunneling, the erase pulse being of sufficient length to erase every cell within the block;

(3) subjecting all cells within the block to a word line stress step, by means of which some electrons are driven back into the floating gate of each cell via Fowler-Nordheim tunneling, or to a soft programing step, by means of which some electrons are driven back into the floating gate of each cell via hot electron injection; and (4) subjecting all cells within the block to a second erase pulse, the second erase pulse being at least an order of magnitude shorter than the first erase pulse.

Use of the second erase pulse following either the word line stress step or a soft programming step not only shifts the threshold voltage distribution to a somewhat lower level, but also compresses the distribution. Since compression on the high side of the curve is greater than on the low side, the length of the second erase pulse can be tailored to fit the characteristics of the particular flash memory.

PREFERRED EMBODIMENT OF THE INVENTION

Drawing FIGS. 2A through 2E graphically represent one of many similar sets of dam obtained by the inventor in support of the present invention. These drawings should be considered merely representative of expected results. Process variability and the actual design of the flash memory used will provide different, though similar results.

Figure 1:
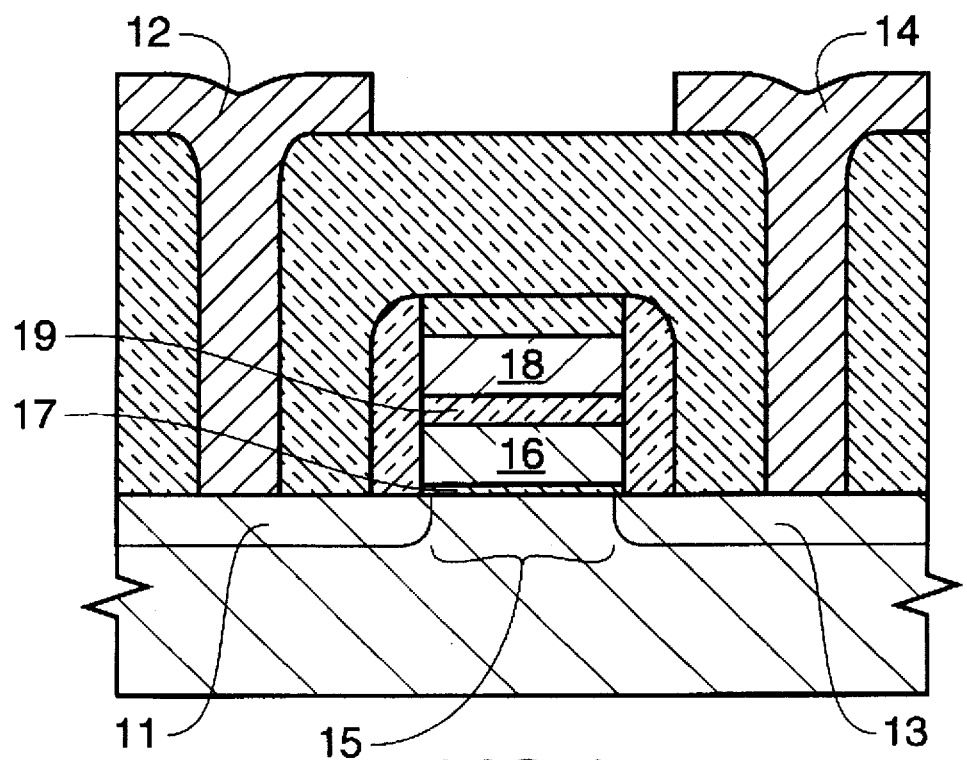
FIG. 1 is a cross-sectional view of a typical flash memory cell.
Figure 2A:
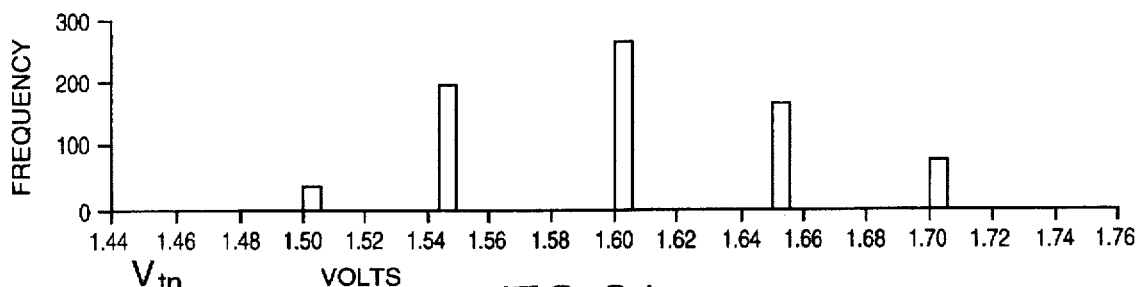
FIG. 2A is an actual threshold voltage distribution for a block of flash memory cells following a baseline ultraviolet light erase step.

Referring now to FIG. 2A, a block of flash memory cells has been exposed to a high-intensity ultraviolet light source in order to provide a baseline starting point for demonstration of the invention. Exposure to the ultraviolet light source was of sufficient duration to ensure that the floating gates of all cells were essentially flee of any surplus electrons. Following ultraviolet exposure, the mean threshold voltage ($V_t$) value was 1.60 volts, the standard diviation of the distribution was 0.05, and the $V_t$ range was from 1.45 to 1.75 volts. It will be noted that the distribution is relatively well-balanced to the left and right of the mean.

Figure 2B:
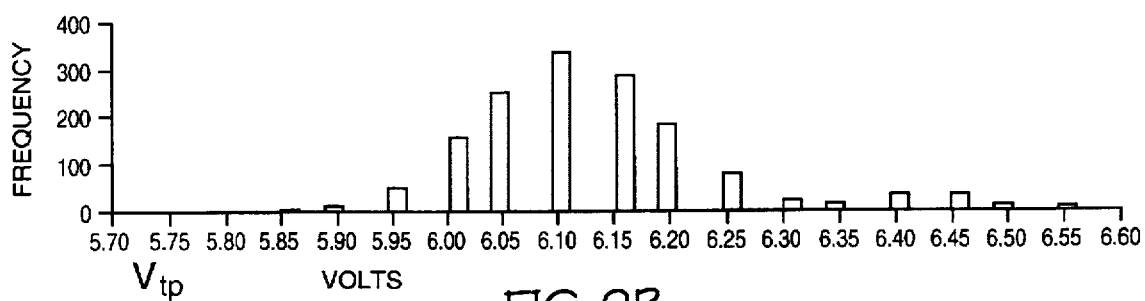
FIG. 2B, is a threshold voltage distribution for the block of flash memory cells of FIG. 2A following a preprogramming step.

Referring now to FIG. 2B, the block of memory cells used to derive the data of FIG. 2A was subjected to a preprogramming, which was accomplished using hot electron injection to drive a surplus of electrons into the floating gate of each cell, (digit line at 6 volts, word line at 12 volts and the source line at 0 volts). Preprogramming was of sufficient duration to ensure that the floating gate of each cell had reached equilibrium with respect to the number of injected electrons. After preprogramming, the mean $V_t$ had increased to 6.13 volts, the standard deviation of the distribution was 0.12, the $V_t$ range was from 5.70 to 6.60 volts, with the spread to the right of the mean being greater than the spread to the left.

Figure 2C:
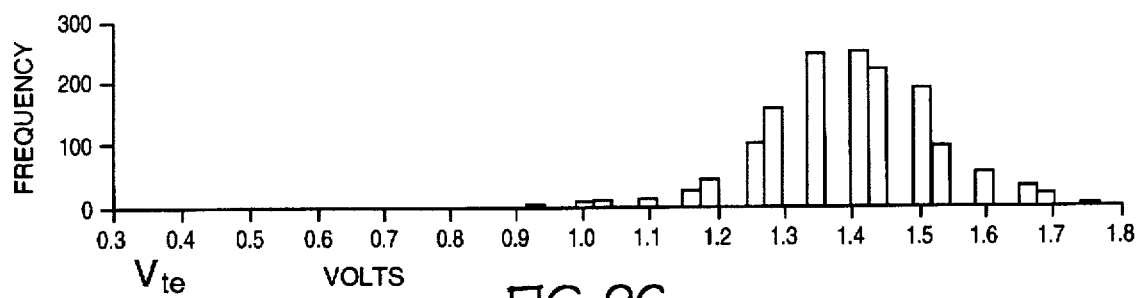
FIG. 2C is a threshold voltage distribution for the block of flash memory cells of FIG. 2B following the application of a 50 millisecond erase pulse.

Referring to FIG. 2C, the block of memory cells used to derive the data of FIGS. 2A and 2B was subjected to a first erase step (digit line floating, word line at 0 volts and the source line at 12 volts) of 50 milliseconds duration. This first erase step causes the surplus electrons within the floating gate of each cell to be driven into the cell's source region via Fowler-Nordheim tunneling. This first erase step is of sufficient duration to erase every cell. After the first erase step, the mean $V_t$ had dropped to 1.40 volts, the standard deviation of the distribution was 0.13, the $V_t$ range was from 0.30 to 1.80 volts, with the spread to the left of the mean being significantly greater than the spread to the right.

Figure 2D:
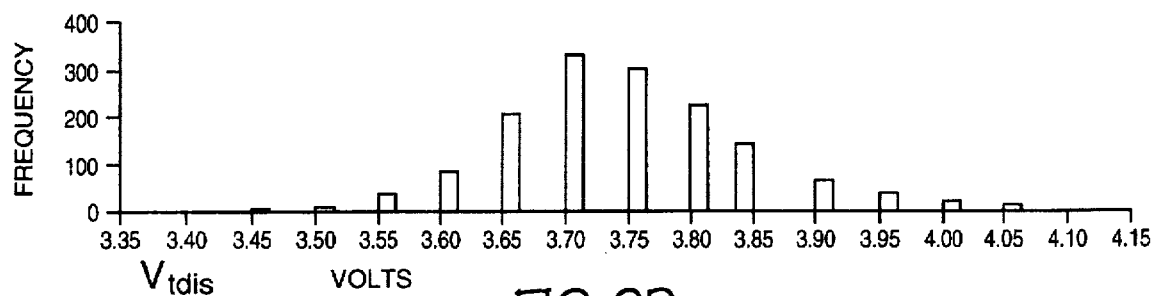
FIG. 2D is a threshold voltage distribution for the block of flash memory cells of FIG. 2C following a word line stress step.

Referring now to FIG. 2D, the block of memory cells used to derive the data of FIGS. 2A, 2B and 2C was subjected to a word line stress step (word line at 12 volts, source line at ground, digit line floating). The word line stress step causes some electrons to be driven back into the floating gate of each cell via Fowler-Nordheim tunneling. An equivalent result may be achieved by subjecting the cells to a soft programming step, by means of which some electrons are driven back into the floating gate of each cell via hot electron injection. After the word line stress step, the mean $V_t$ had increased to 3.74 volts, the standard deviation of the distribution was 0.1, the $V_t$ range was from 3.35 to 4.15 volts, with the spread to the right of the mean being significantly greater than the spread to the left. As an alternative to the word line stress step, the cells may be subjected to a soft programming step whereby approximately the same number of electrons are driven back into the floating gate of each cell by hot electron injection rather than Fowler-Nordheim tunneling.

Figure 2E:
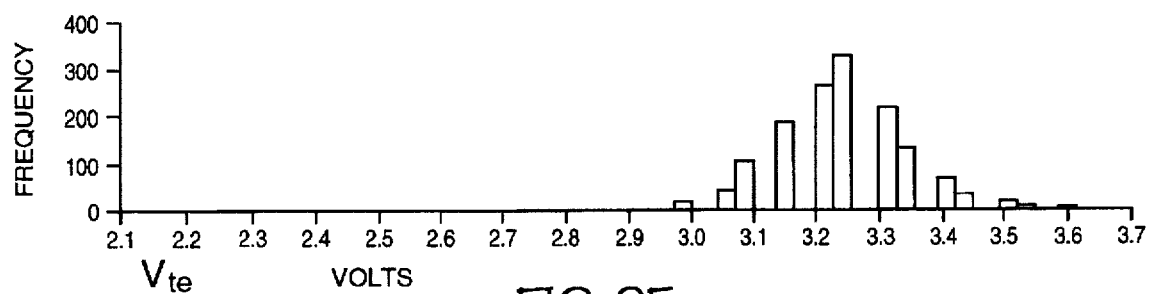
FIG. 2E is a threshold voltage distribution for the block of flash memory cells of FIG. 2D following the application of a 1 millisecond erase pulse.

Referring now to FIG. 2E, the block of memory cells used to derive the date of FIGS. 2A, 2B, 2C and 2E was subjected to a second erase step (same parameters as those used for the data of FIG. 2C) of 1 millisecond duration. After the second erase step, the mean $V_t$ had dropped to 3.24 volts, the standard deviation of the distribution was 0.12, the $V_t$ range was from 2.99 to 3.6 volts, with the spread to the right of the mean being significantly compressed as compared to the $V_t$ spread prior to the second erase step. It will also be noted that the grouping is much more compact, and that the total spread has been reduced from 0.8 volts following the word line stress step to 0.61 volts following the second erase step.

Although only a single embodiment of the invention has been disclosed herein, it will be obvious to those having ordinary skill in the art of floating gate memory design and manufacture that changes and modifications may be made thereto without departing from the scope and the spirit of the invention as hereinafter claimed.

What is claimed is:

1. A method for erasing a block of flash memory cells, each cell comprising a field-effect transistor having a control gate, a floating gate, a source region coupled to a source line, a drain region coupled to a digit line, and a channel region coupling said source and drain regions, said method comprising the following sequence of steps:

(a) preprogramming all cells within the block to be erased using hot electron injection to drive a surplus of electrons into the floating gate of each cell;

(b) subjecting all cells within the block to a first erase pulse which causes the surplus electrons within the floating gate of each cell to be driven into the cell's source region via Fowler-Nordheim tunneling, the erase pulse being of sufficient length to erase every cell within the block;

(c) driving some electrons back into the floating gate of each cell; and (d) subjecting all cells within the block to a second erase pulse, the second erase pulse being shorter than the first erase pulse.

2. The process of claim 1, wherein some electrons are driven back into the floating gate of each cell in step (c) via Fowler-Nordheim tunneling effected by a word line stress step.

3. The process of claim 1, wherein some electrons are driven back into the floating gate of each cell in step (c) via hot electron injection effected by a soft programming step.

4. The method of claim 1, wherein hot electron injection associated with step (a) is allowed to continue until the floating gates all cells within the block reach a surplus electron saturation level for the employed preprogramming voltage.

5. The method of claim 4, wherein compression effected by the second erase pulse is greater on the high side of the threshold voltage distribution than on the lower side.

6. The method of claim 1, wherein said second erase pulse length is at least an order of magnitude shorter than said first erase pulse.

7. The method of claim 1, wherein the second erase pulse results in a compression of the threshold voltage distribution, and in a shifting of average threshold voltage to a lower value.

8. An method for narrowing threshold voltage distribution among the individual cells in a block of flash memory cells which have undergone a preprogramming step, a subsequent first erase step, and a word line stress step following the first erase step, wherein the method comprises the step of performing a second erase step following the word line stress step.

9. The method of claim 8, wherein the second erase step is of a duration that is at least an order of magnitude shorter than the duration of the first erase step.

10. The method of claim 8, wherein the second erase step effects a compression of the threshold voltage distribution and a shifting of average threshold voltage to a lower value.

11. The method of claim 10, wherein compression effected by the second erase step is greater on the high side of the threshold voltage distribution than on the lower side.

12. An method for narrowing threshold voltage distribution among the individual cells in a block of flash memory cells which have undergone a preprogramming step, a subsequent first erase step, and a soft programming step following the first erase step, wherein the method comprises the step of performing a second erase step following the soft programming step.

13. The method of claim 12, wherein the second erase step is of a duration that is at least an order of magnitude shorter than the: duration of the first erase step.

14. The method of claim 8, wherein the second erase step effects a compression of the threshold voltage distribution and a shifting of average threshold voltage to a lower value.

15. The method of claim 14, wherein compression effected by the second erase step is greater on the high side of the threshold voltage distribution than on the lower side.

* * * * *